(12) United States Patent
Nam et al.

(10) Patent No.: US 9,482,940 B2
(45) Date of Patent: Nov. 1, 2016

(54) BLANKMASK AND PHOTOMASK

(71) Applicant: S&S TECH Co., Ltd., Daegu (KR)

(72) Inventors: Kee-Soo Nam, Daegu (KR); Geung-Won Kang, Daegu (KR); Cheol Shin, Daegu (KR); Jong-Hwa Lee, Daegu (KR); Chul-Kyu Yang, Daegu (KR); Chang-Jun Kim, Daegu (KR); See-Jun Jeong, Daegu (KR); Kyu-Jin Jang, Daegu (KR)

(73) Assignee: S&S TECH CO., LTD., Daegu (KR)

( * ) Notice: Subject to any disclaimer, the term of this patent is extended or adjusted under 35 U.S.C. 154(b) by 190 days.

(21) Appl. No.: 14/503,977

(22) Filed: Oct. 1, 2014

(65) Prior Publication Data

US 2015/0093689 A1    Apr. 2, 2015

(30) Foreign Application Priority Data

Oct. 2, 2013 (KR) ........................ 10-2013-0117681

(51) Int. Cl.
```
G03F 1/46      (2012.01)
G03F 1/38      (2012.01)
G03F 1/54      (2012.01)
G03F 1/58      (2012.01)
```
(52) U.S. Cl.
CPC . *G03F 1/46* (2013.01); *G03F 1/38* (2013.01); *G03F 1/54* (2013.01); *G03F 1/58* (2013.01)

(58) Field of Classification Search
CPC .............. G03F 1/46; G03F 1/38; G03F 1/54; G03F 1/58
USPC .............................................. 430/5
See application file for complete search history.

(56) References Cited

U.S. PATENT DOCUMENTS 8,574,793 B2 * 11/2013 Kominato ................. G03F 1/58
430/5

FOREIGN PATENT DOCUMENTS

| CN | 101154035 A | 4/2008 |
|---|---|---|
| JP | 2012141583 A | 7/2012 |
| TW | 200625012 A | 11/1994 |
| TW | I409580 B | 9/2013 |

* cited by examiner

*Primary Examiner* — Christopher Young
(74) *Attorney, Agent, or Firm* — William Park & Associates Ltd.

(57) ABSTRACT

Provided is a photomask having a high-resolution pattern of a half-pitch of 32 nm or less (particularly, a half-pitch of 22 nm or less), which is manufactured by forming a blankmask in which a light-proof film and a hard film having a small thickness and high etch selectivity with respect to the light-proof film are formed on a transparent substrate. The photomask may have a high quality by adjusting a composition ratio of a metal, silicon (Si), and light elements that constitute the light-proof film to suppress damage to the pattern caused by an $XeF_2$ gas in an electron-beam repair process.

12 Claims, 1 Drawing Sheet

BLANKMASK AND PHOTOMASK

CROSS-REFERENCE TO RELATED APPLICATION

This application claims priority to and the benefit of Korean Patent Application No. 2013-0117681, filed on Oct. 2, 2013, the disclosure of which is incorporated herein by reference in its entirety.

BACKGROUND

1. Field of the Invention

The present invention relates to a blankmask and a photomask, and more particularly, to a blankmask including a hard film that is applicable to a half-pitch of 32 nm or less and particularly, a half-pitch of 22 nm or less, and a photomask.

2. Discussion of Related Art

Today, as the integration degrees of semiconductor devices become higher, a photolithography technology has been developed to be used at a 436 nm g-line, a 405 nm h-line, a 365 nm i-line, 248 nm KrF laser, and 193 nm ArF laser so as to improve the resolution of a semiconductor circuit pattern. Also, as a blankmask structure has been developed to improve characteristics thereof, e.g., a binary intensity blankmask, a phase shift blankmask, or the like.

As part of an effort to increase the resolution of a semiconductor circuit pattern, a blankmask including a hard film has been recently developed and used. In the blankmask including the hard film, a hard film having high etch selectivity with respect to a light-proof film and having a small thickness is used as a mask for etching a light-proof film, rather than a resist film, unlike in the existing binary intensity blankmask or phase shift blankmask. The hard film has a small thickness and a short etching time, compared to the light-proof film. Thus, the hard film enables a resist film to be formed in a thin film and reduces scattering of electrons when an electron-beam exposure is performed, thereby forming a high-precision pattern.

A photomask manufactured using a blankmask including the hard mask is manufactured using a lithography process including writing, developing, etching, inspection, repair, and cleaning processes, similar to a general binary intensity blankmask and a phase shift photomask.

Among these processes, a method using a focused ion beam is initially applied to the repair process. However, in the repair process using the focused ion beam, when a light-proof film is formed on a transparent substrate using a molybdenum silicide (MoSi) compound (particularly, silicon (Si) as a main component), the transparent substrate is also formed using $SiO_2$ including silicon (Si) as a main component. Thus, the transparent substrate may be damaged when the light-proof film is repaired.

Thus, a repair method using an electron beam has been recently used to reduce defects caused by damage to a pattern of the light-proof film and reduce damage to the transparent substrate after the repair process is performed. However, although the repair method using the electron beam is applicable to a half-pitch of 32 nm or less (particularly, a half-pitch of 22 nm or less) and can solve problems of the repair process using the focused ion beam, the following problems may occur.

In the electron-beam repair process, $XeF_2$ is used as a repair process gas. The light-proof film is etched by a fluorine (F) component contained in the $XeF_2$ gas when the light-proof film is formed of a molybdenum silicide (MoSi) compound. Thus, in the electron-beam repair process, when a region adjacent to a region of the light-proof film that has been first repaired is repaired, the first repaired region is continuously damaged by the $XeF_2$ gas. Finally, a critical dimension (CD) of a pattern changes to cause the pattern to be damaged.

SUMMARY OF THE INVENTION

The present invention is directed to a blankmask in which a light-proof film and a hard film are formed on a transparent substrate so that the blankmask can be applied to a half-pitch of 32 nm or less (particularly, a half-pitch of 22 nm or less), and a photomask.

The present invention is also directed to a blankmask including a light-proof film capable of preventing a pattern from being damaged by an $XeF_2$ gas during an electron-beam repair process and having high optical properties, and a photomask.

According to an aspect of the present invention, there is provided a blankmask which includes a light-proof film and a hard film formed on a transparent substrate, wherein a degree to which the light-proof film is damaged by an injected gas in a repair process after a pattern is formed is digitized in an anisotropic ratio of 0 to 0.5, wherein the anisotropic ratio is a ratio of a lateral damage to an etched depth of the pattern.

The repair process may be an electron-beam repair process, and the injected gas may be $XeF_2$.

The light-proof film may be formed of a molybdenum silicide (MoSi) compound selected from the group consisting of MoSi, MoSiO, MoSiN, MoSiC, MoSiON, MoSiCN, MoSiOC, MoSiCON, MoSiB, MoSiBO, MoSiBN, MoSiBC, MoSiBON, MoSiBCN, MoSiBOC, and MoSiBCON.

The light-proof film may have a composition ratio in which a content of molybdenum (Mo) is 1 at % to 15 at %, a content of silicon (Si) is 40 at % to 80 at %, a content of nitrogen (N) is 15 at % to 35 at %, a content of boron (B) is 0 to 5 at %, a content of carbon (C) is 0 to 5 at %, and a content of oxygen (O) is 0 to 5 at %.

The light-proof film formed of the molybdenum silicide (MoSi) compound may be formed using a molybdenum silicide (MoSi) target or a molybdenum silicide boron (MoSiB) target. The molybdenum silicide (MoSi) target may have a composition ratio in which Mo:Si=2 at % to 20 at %:98 at % to 80 at %. The molybdenum silicide boron (MoSiB) target may have a composition ratio in which Mo:Si:B=2 at % to 20 at %:97 at % to 70 at %:1 at % to 10 at %.

The light-proof film may have a structure selected from the group consisting of a single-layer film, a continuous single-layer film, a multi-layer film, and a continuous multi-layer film.

When the light-proof film has a two-layer structure including a light-shielding film and an anti-reflective film, the light-shielding film and the anti-reflective film may be different in terms of a content of at least one among molybdenum (Mo), silicon (Si), and nitrogen (N), wherein a content of molybdenum (Mo) is 0 to 10 at %, a content of silicon (Si) is 0 to 40 at %, and a content of nitrogen (N) is 0 to 10 at %.

When the light-proof film has a two-layer structure including a light-shielding film and an anti-reflective film, the light-shielding film may have a thickness of 35 nm to 50 nm and the anti-reflective film may have a thickness of 3 nm to 20 nm.

The light-proof film may have an optical density of 2.5 to 3.5 at an exposure wavelength of 193 nm.

The light-proof film may have a surface reflectivity of 40% or less at an exposure wavelength of 193 nm.

The hard film may be formed of at least one metal material selected from the group consisting of molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W), and silicon (Si), or may be formed of the selected at least one metal material and at least one material selected from the group consisting of oxygen (O), nitrogen (N), carbon (C), and boron (B).

The hard film may be formed of a chromium (Cr) compound selected from the group consisting of Cr, CrO, CrN, CrC, CrON, CrOC, CrCN, CrCON, CrB, CrBO, CrBN, CrBC, CrBON, CrBOC, CrBCN, and CrBCON.

The hard film may have a thickness of 2 nm to 5 nm.

The hard film may have an etching speed of 0.4 Å/sec to 2.0 Å/sec.

An etch selectivity between the hard film and the light-proof film may be 1:20 or more.

A resist film may be formed on the hard film to a thickness of 600 Å to 1200 Å.

According to another aspect of the present invention, there is provided a photomask manufactured using one of the blankmasks described above.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention set forth herein are not intended to restrict the spirit and scope of the present invention defined in the claims and are only used for a better understanding of the present invention. Thus, it would be obvious to those of ordinary skill in the art that the above exemplary embodiments are to cover all modifications, equivalents, and alternatives falling within the scope of the invention. Accordingly, it will be understood that various changes in form and details may be made therein without departing from the spirit and scope of the following claims.

Figure 1:
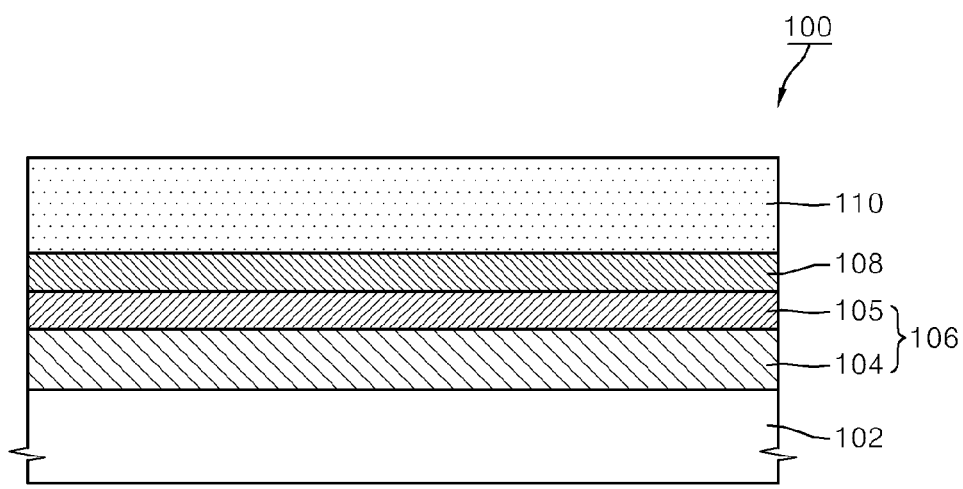
FIG. 1 is a cross-sectional view of a blankmask including a hard film according to an embodiment of the present invention.

FIG. 1 is a cross-sectional view of a blankmask 100 including a hard film according to an embodiment of the present invention.

Referring to FIG. 1, the blankmask 100 according to an embodiment of the present invention includes a transparent substrate 102, and a light-proof film 106 and a hard film 108 that are sequentially stacked on the transparent substrate 102. The light-proof film 106 may be a multi-layer film including two or more films such as a light-shielding film 104 and an anti-reflective film 105 but may be a single-layer film.

The transparent substrate 102 may have a birefringence rate of 2 nm or less and a degree of flatness of 0.3 µm with respect to a thickness thereof at an exposure wavelength of 193 nm. A desired pattern critical dimension (CD) according to an embodiment of the present invention is a half-pitch of 32 mm or less and particularly, a half-pitch of 22 nm or less when final wafer printing is performed. However, the size of such a highly fine pattern causes a focus margin to be small when a wafer is exposed, thereby making it difficult to form a process window. Thus, the transparent substrate 102 may have a degree of flatness of 0 to physically secure a process window margin but cannot be substantially processed to have the degree of flatness of 0. Thus, in order to secure a high process window margin within a minimum range, the transparent substrate 102 may have a degree of flatness of 0.3 µm or less and particularly, a degree of flatness of 0.2 µm or less.

The light-proof film 106 may be formed of a molybdenum silicide (MoSi) compound. However, when the light-proof film 106 is formed of a molybdenum silicide (MoSi) compound, silicon (Si) that constitutes the light-proof film 106 and fluorine (F) that constitutes a repair gas react with each other to greatly damage the pattern in an electron-beam repair process using an $XeF_2$ gas which is performed after a pattern is formed. Thus, in order to prevent such repair damage from occurring, the light-proof film 106 is formed of at least one material selected from the group consisting of oxygen (O), nitrogen (N), carbon (C), and boron (B). In detail, the light-proof film 106 may be formed of a molybdenum silicide (MoSi) compound selected from the group consisting of MoSi, MoSiO, MoSiN, MoSiC, MoSiON, MoSiCN, MoSiOC, MoSiCON, MoSiB, MoSiBO, MoSiBN, MoSiBC, MoSiBON, MoSiBCN, MoSiBOC, and MoSiBCON.

When the light-proof film 106 is formed of oxygen (O), the light-proof film 106 may be suppressed from being damaged in the repair process but is difficult to be formed in a thin film and an optical density of the light-proof film 106 increases. Thus, in the light-proof film 106 according to an embodiment of the present invention, the content of oxygen (O) in the molybdenum silicide (MoSi) compound is minimized.

When the light-proof film 106 contains boron (B), boron (B) increases the electric conductivity of the light-proof film 106 to reduce the rate of errors when a thin film is formed and reduce stress to be applied to the thin film. However, the light-proof film 106 is difficult to be formed in a thin film when it contains a large amount of boron (B).

Thus, the light-proof film 106 may have a composition ratio in which the content of molybdenum (Mo) is 1 at % to 15 at %, the content of silicon (Si) is 40 at % to 80 at %, the content of nitrogen (N) is 15 at % to 35 at %, the content of boron (B) is 0 to 5 at %, the content of carbon (C) is 0 to 5 at %, and the content of oxygen (0) is 0 to 5 at %. As described above, when the contents of boron (B) and oxygen (O) in the light-proof film 106 each exceed 5 at %, it is difficult to form the light-proof film 106 in a thin film and satisfy a desired optical density of the light-proof film 106.

The light-proof film 106 may be formed of not only molybdenum silicide (MoSi) but also at least one metal material selected from the group consisting of molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W), and silicon (Si). Otherwise, the light-proof film 106 may be formed of the selected at least one metal material and at least one material selected from the group consisting of oxygen (O), nitrogen (N), carbon (C), and boron (B).

The light-proof film 106 is formed using a molybdenum silicide (MoSi) target or a molybdenum silicide boron (MoSiB) target. In this case, the molybdenum silicide (MoSi) target has a composition ratio in which Mo:Si=2 at %:98 at % to 80 at %, and the molybdenum silicide boron (MoSiB) target has a composition ratio in which Mo:Si:B=2 at % to 20 at %:97 at % to 70 at %:1 at % to 10 at %.

When the light-proof film 106 contains boron, the light-proof film 106 may be formed using a molybdenum silicide boron (MoSiB) target or may be formed by injecting $BH_3$ as a process gas when a molybdenum silicide (MoSi) target is used.

A repair process may be performed on a photomask, which is formed using a blankmask, according to an electron-beam repair method using an $XeF_2$ gas. In this case, the higher the content of molybdenum (Mo) in the molybdenum silicide (MoSi) target for forming the light-proof film 106, i.e., the higher the content of molybdenum (Mo) in the light-proof film 106, the less a pattern of the light-proof film 106 may be damaged when the repair process is performed. This phenomenon occurs when a fluorine (F) component in the $XeF_2$ gas reacts with silicon (Si) in a molybdenum silicide (MoSi) compound or a molybdenum silicide boron (MoSiB) compound used to form the light-proof film 106 to cause the pattern of the light-proof film 106 to be damaged.

When the content of molybdenum (Mo) in a single target formed of molybdenum silicide (MoSi) is greater than 20 at %, the light-proof film 106 is vulnerable to chemicals used in a cleaning process included in a photomask process, e.g., ozone water ($O_3$), SC-1, sulfuric acid, etc., thereby reducing the thickness and optical density of the light-proof film 106. When the content of molybdenum (Mo) in the single target formed of molybdenum silicide (MoSi) is less than 2 at %, an unstable discharge occurs during sputtering, thereby causing a defect to occur to a large extent. Thus, the content of a molybdenum silicide (MoSi) target used to form the light-proof film 106 of the blankmask 100 according to an embodiment of the present invention may be in the range of Mo:Si=2 at % to 20 at %:98 at % to 80 at %, and particularly, in the range of Mo:Si=5 at % to 10 at %:95 at % to 90 at %.

Also, the light-proof film 106 may be manufactured using a target containing molybdenum silicide (MoSi) and boron (B). Boron (B) increases the electric conductivity of a target during DC sputtering to prevent an arc from occurring when a thin film is formed, thereby reducing defects. Also, when the light-proof film 106 contains boron (B), the Atomic Peening Effect may decrease during sputtering to reduce stress to be applied to the thin film. When the content of boron (B) is high, the features of the light-proof film 106 change, e.g., an optical density of the light-proof film 106 decreases, by sputtering. Thus, the content of boron (B) is limited. Thus, boron (B) may be selectively contained in a molybdenum silicide (MoSi) target used to form the light-proof film 106. In this case, the content of boron (B) may be in the range of 0 to 5 at %, and particularly, in the range of 0 to 3 at %.

The light-proof film 106 of the blankmask 100 according to an embodiment of the present invention may be designed to be a single-layer film, a continuous single-layer film, a multi-layer film, or a continuous multi-layer film according to the characteristics of the blankmask 100.

In detail, damages are substantially caused by the difference between the features of materials of the light-shielding film 104 and the anti-reflective film 105 that constitute the light-proof film 106 during the electron-beam repair process. That is, the light-shielding film 104 and the anti-reflective film 105 differently react with fluorine (F) due to different composition ratios of a molybdenum silicide (MoSi) compound thereof, thereby causing the light-shielding film 104 and the anti-reflective film 105 to be damaged to different degrees. To solve this problem, the light-proof film 106 may be best recommended to be formed in a single-layer structure. However, when the light-proof film 106 is formed in a single-layer structure, the reflectivity of the light-proof film 106 at an exposure wavelength increases to cause a flare phenomenon to occur when a wafer is exposed. Therefore, the reflectivity of the light-proof film 106 should be reduced. Thus, as a method of solving problems occurring due to the reflectivity of the light-proof film 106 while minimizing electron-beam repair damages, an optical density may be considered and the content of nitrogen (N) may be relatively increased to suppress the reflectivity of the light-proof film 106 at an exposure wavelength in the case of a single-layer film. Also, when the light-proof film 106 is formed in a continuous single-layer film, the composition ratio thereof changes, an optical density may be considered, and the content of nitrogen (N) may be increased from a depth-wise direction to a surface-wise direction, thereby suppressing the reflectivity of the light-proof film 106. When the light-proof film 106 is formed in a multi-layer film including the light-shielding film 104 and the anti-reflective film 105 that are formed of the same components, the difference between the contents of nitrogen (N) contained in the light-shielding film 104 and the anti-reflective film 105 may be minimized to minimize the difference between damages to the light-shielding film 104 and the anti-reflective film 105 and suppress the reflectivity of the light-proof film 106. Furthermore, when the light-proof film 106 is formed in a continuous multi-layer film, the content of nitrogen (N) in the light-shielding film 104 or the anti-reflective film 105 may be continuously increased to suppress the reflectivity of the light-proof film 106. Among these methods, the light-proof film 106 is most preferably formed in a multi-layer film to minimize the difference between the contents of nitrogen (N) in the light-shielding film 104 and the anti-reflective film 105 of the light-proof film 106, thereby minimizing the difference between damages to the light-shielding film 104 and the anti-reflective film 105, In the electron-beam repair process, the degree to which the light-proof film 106 is damaged by injection of an $XeF_2$ gas may be digitized in an anisotropic ratio.

Figure 2:
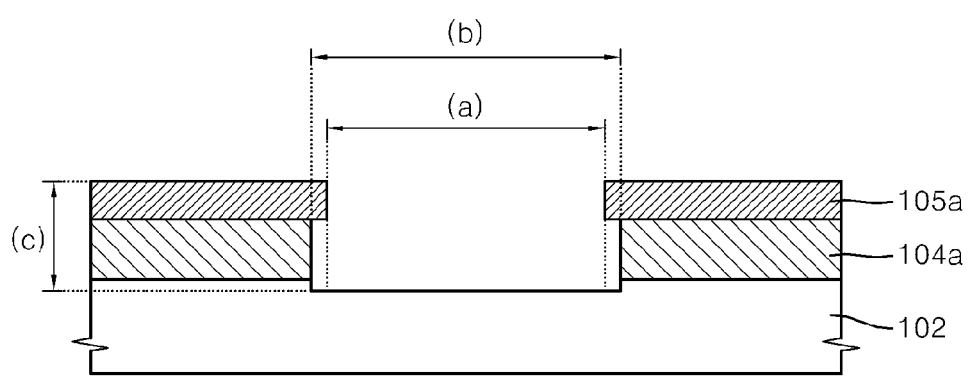
FIG. 2 is a diagram illustrated to define an anisotropic ratio.

FIG. 2 is a diagram illustrated to define an anisotropic ratio.

Referring to FIG. 2, damages caused by an $XeF_2$ gas in a repair process may be classified into a lateral damage and an etched-depth damage. The anisotropic ratio may be expressed in a ratio of a lateral damage to an etched depth of a pattern (i.e., Δlateral/etched depth). In detail, a value obtained by subtracting the diameter a of a target pattern from an etched width b of a substrate is the lateral damage ΔLateral, and the sum of the thicknesses of the anti-reflective film 115 and the light-shielding film 114 and a damaged depth of the substrate (including damage to the substrate that may occur in the repair process) is an etched depth c of the pattern. When the anisotropic ratio is 0.5 or more, the lateral damage ΔLateral in the depth-wise direction of the pattern is high to cause a pattern CD to be different from a target pattern CD. Thus, the anisotropic ratio may be in the range of 0 to 0.5 and preferably, in the range of 0 to 0.4.

As described above, when the light-proof film 106 is formed in a multi-layer film, i.e., when the light-proof film 106 has a two-layer structure including the light-shielding film 104 and the anti-reflective film 105, the light-shielding film 104 and the anti-reflective film 105 have different composition ratios and thus the degrees to which a fluorine (F) component in $XeF_2$ react with silicon (Si) in the light-shielding film 104 and silicon (Si) in the anti-reflective film 105 are different. In detail, the contents of oxygen (O), nitrogen (N), carbon (C), boron (B), and the like in the light-shielding film 104 formed of a molybdenum silicide (MoSi) compound are lower than those in the anti-reflective film 105 to increase the light-shielding property of the light-shielding film 104. Thus, repair damage occurring in the light-shielding film 104 is higher than that in the anti-reflective film 105. Accordingly, the difference between the reaction rates of the anti-reflective film 105 and the light-shielding film 104 with respect to fluorine (F) should be reduced. Thus, the difference between the composition ratios of components of the light-shielding film 104 and the anti-reflective film 105 may be minimized to minimize repair damage. In particular, the anisotropic ratio is set to be in the target range of 0 to 0.5. In detail, when the light-proof film 106 is formed in a two-layer structure including the light-shielding film 104 and the anti-reflective film 105, the difference between composition ratios of nitrogen (N) in the light-shielding film 104 and the anti-reflective film 105 may be set to be 10 at % or less. Also, the difference between composition ratios of molybdenum (Mo) in the light-shielding film 104 and the anti-reflective film 105 may be set to be 10 at % or less, and the difference between composition ratios of silicon (Si) in the light-shielding film 104 and the anti-reflective film 105 may be set to be 40 at % or less.

The light-proof film 106 has an optical density of 2.5 to 3.5 and a surface reflectivity of 40% or less at an exposure wavelength of 193 nm.

When the light-proof film 106 is formed in a two-layer structure including the light-shielding film 104 and the anti-reflective film 105, the light-shielding film 104 has a thickness of 35 nm to 50 nm and the anti-reflective film 105 has a thickness of 3 nm to 20 nm.

The hard film 108 may be formed of at least one metal material selected from the group consisting of molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W), and silicon (Si). Otherwise, the hard film 108 may be formed of the selected at least one metal material and at least one material selected from the group consisting of oxygen (O), nitrogen (N), carbon (C), and boron (B).

The hard film 108 may be formed of a chromium (Cr) compound, and may include one of Cr, CrO, CrN, CrC, CrON, CrOC, CrCN, CrCON, CrB, CrBO, CrBN, CrBC, CrBON, CrBOC, CrBCN, and CrBCON.

The hard film 108 may have a small thickness and a high etching speed to form a resist film 110 in a thin film. To this end, the hard film 108 may have a thickness of 2 nm to 5 nm. If the thickness of the hard film 108 is greater than 5 nm, a CD deviation may increase due to the loading effect when the hard film 108 is etched using the resist film 110 as an etch mask. When the thickness of the hard film 108 is less than 2 nm, the etch selectivity of the hard film 108 with respect to the light-proof film 106 is low and the hard film 108 is thus difficult to be used as an etch mask.

When the hard film 108 has a low etching speed, the etch selectivity of the hard film 108 with respect to the resist film 110 is low, thus making it difficult to form the resist film 110 in a thin film. Thus, the etching speed of the hard film 108 may be in a range of 0.4 Å/sec to 2.0 Å/sec. An etch selectivity between the hard film 108 and the light-proof film 106 may be 1:20 or more.

The resist film 110 may have a thickness of 600 Å to 1,200 Å and may be a chemically amplified resist (CAR).

The light-proof film 106 and the hard film 108 may be selectively thermally treated. A thermal treatment process may be performed using at least one selected from the group consisting of a rapid thermal process (RTP), vacuum hotplate baking, plasma, and a furnace.

A photomask may be manufactured by performing on a lithography process including writing, developing, etching, inspection, repair, and cleaning processes on the blankmask 100.

In a blankmask according to an embodiment of the present invention, a composition ratio of a metal, silicon (Si), and light elements that constitute a light-proof film is adjusted to suppress a pattern to be damaged by an $XeF_2$ gas during the electron-beam repair process.

Furthermore, although not shown, a blankmask according to an embodiment of the present invention may further include an etch stopping film interposed between a transparent substrate and a light-proof film in consideration of etch selectivity. Also, a phase shifting film may be inserted into a top or bottom layer of the light-proof film to increase the precision of the pattern.

A blankmask according to an embodiment of the present invention will be described in detail below.

EXAMPLES

Evaluation of Blankmask that was Electron-Beam Repaired

An electron-beam repair process was performed on a blankmask according to the present invention, and the features of a light-proof film (including damage to a pattern) were evaluated. The blankmask was manufactured by forming a light-proof film and a hard film on a transparent substrate having a size of 6 inch×6 inch×0.25 inch using a DC magnetron sputtering device.

Specifically, a substrate controlled to have a birefringence of 2 nm or less, a degree of flatness of 0.16 μm, and a transmissivity of 90.3% at an exposure wavelength of 193 nm was used as the transparent substrate.

The light-proof film was designed to have a two-layer structure in which a light-shielding film which is a lower layer was formed using a molybdenum silicide (MoSi) target (composition ratio of Mo:Si=10 at %:90 at %), a process gas (Ar:$N_2$=7 sccm:3 sccm), and process power of 0.6 kW. Also, an anti-reflective film which is an upper layer was formed using a molybdenum silicide (MoSi) target (composition ratio of Mo:Si=10 at %:90 at %), a process gas (Ar:$N_2$=7.5 sccm:9.0 sccm), and process power of 0.7 kW. A thickness of the light-proof film was measured with an XRR device using an X-ray Source. As a result of the measurement, the light-proof film had a thickness of 475.4 Å. An optical density of the light-proof film was calculated by measuring a transmissivity thereof at an exposure wavelength of 193 nm using Cary-5000 which is an UV-VIS spectrometer. As a result of the calculation, the light-proof film had an optical density of 2.86 and a transmissivity of 33.8% at the exposure wavelength of 193 nm. Also, a composition ratio of the light-proof film was analyzed using AES equipment. As a result of the analysis, the light-shielding film had a composition ratio in which Mo:Si:N=10.1 at %:70.5 at %:19.4 at % and the anti-reflective film had a composition ratio in which Mo:Si:N=5 at %:65.2 at %:29.8 at %. The light-shielding film and the anti-reflective film had different composition ratios in which the content of molybdenum (Mo) was 5.1 at %, the content of silicon (Si) was 5.3 at %, and the content of nitrogen (N) was 10.0 at %.

Thereafter, the light-proof film was thermally processed at 350° C. for twenty minutes using a vacuum RTP before a hard film was formed, and the hard film was then formed on the light-proof film. The hard film was formed to a thickness of 4 nm using a chromium (Cr) target, argon (Ar) gas of 8 sccm as a process gas, and process power of 0.7 kW.

Repair damage to the blankmask was evaluated using E-beam repair equipment manufactured by Merit. The evaluation was performed by injecting an $XeF_2$ gas for 120 seconds after the electron-beam repair process. An etched depth in a pattern of a photomask was measured using an atomic force microscope (AFM) and lateral damage ΔLateral was observed by scanning electronic microscopy (CD-SEM). As a result, the etched depth in the pattern of the photomask was 50 nm, the lateral damage ΔLateral was 19 nm (=9.5 nm×2 (both surfaces)), and an anisotropic ratio was 0.38. Accordingly, it was concluded that repair damage did not occur.

Evaluation of Repair Damage According to Composition Ratio of Sputtering Target Repair damage was measured according to a composition ratio of a sputtering target, based on the evaluation of the characteristics of the blankmask related to the electron-beam repair process described above.

All features of the light-proof film, such as not only electron-beam repair features but also film-forming stability, chemical resistance, etc., are required to be excellent as described above. Thus, in the present examples, film-forming stability according to a target composition, a variation in the thickness of the light-proof film related to chemical resistance (SC-1, $O_3$), and electron-beam repair damage were evaluated.

TABLE 1

| | Target | Light-shielding film (Mo:Si:N) | Anti-reflective film (Mo:Si:N) | Discharge stability | Thickness variation (SC-1&$O_3$) | Anisotropic ratio | O.D @193 nm | Stress variation (ΔTIR) |
|---|---|---|---|---|---|---|---|---|
| Example 1 | MoSi [2:98] | 4:74:22 | 3:69:28 | ○ | 5 Å | 0.45 | 2.80 | 0.09 μm |
| Example 2 | MoSi [10:90] | 10.1:70.5:19.4 | 5:65.2:29.8 | ○ | 9 Å | 0.34 | 2.85 | 0.07 μm |
| Example 3 | MoSi [20:80] | 12.3:67.3:20.4 | 8:63.5:28.5 | ○ | 13 Å | 0.31 | 2.93 | 0.07 μm |
| Comparative example 1 | Si | 0:84.5:15.5 | 0:74.3:25.7 | X | 3 Å | 0.52 | 2.84 | 0.13 μm |
| Comparative example 2 | MoSi [30:70] | 17.3:64.2:18.5 | 10.2:60:29.8 | ○ | 25 Å | 0.23 | 3.05 | 0.05 μm |

Referring to Table 1, when a light-shielding film and an anti-reflective film were formed using targets having composition ratios of MoSi[2:98], MoSi[10:90], and MoSi[20:80] as in Examples 1 to 3, film-forming stability was low (particularly, instability was caused due to an arc, etc.) when these films were formed. Also, the chemical resistances of the formed light-shielding film and anti-reflective film were evaluated. The evaluation was performed by processing the light-proof film three times for twenty minutes using SC-1 ($NH_4OH$:$H_2O_2$:DIW=1:1:5, 40° C./1 hr) and $O_3$ at 120 ppm, and observing a variation in the thickness of the light-proof film. As a result, the thickness of the light-proof film changed in the range of 5 Å to 13 Å, and thus any problems did not occur due to the chemical resistance of the light-proof film.

Also, an anisotropic ratio was less than 0.5 related to electron-beam repair and thus any problems did not occur due to the anisotropic ratio.

However, in the case of Comparative Example 1, the content of silicon (Si) was 80 at % or more. Thus, an anisotropic ratio was 0.52 and a stress variation was high, i.e., 0.13 μm, related to electron-beam repair. When the MoSi[30:70] target according to Comparative Example 2 was used, the content of molybdenum (Mo) was 17.3 at %. Accordingly, the chemical resistance of the light-proof film was low since a variation in the chemical resistance of the light-proof film was 25 Å.

Evaluation of Repair Damage when Target Containing Boron (B) was Used

A light-proof film was formed using a molybdenum silicide (MoSi) target containing boron (B), and repair damage thereto was measured. In this case, a molybdenum silicide boron (MoSiB) target obtained by doping boron (B) at a concentration of 5 at % to 10 at % to the molybdenum silicide (MoSi) target in Example 2 while the content of molybdenum (Mo) was maintained was used.

TABLE 2

| | Target | Discharge stability | Thickness variation (SC-1 & O₃) | Anisotropic ratio | O.D @193 nm | Stress variation (ΔTIR) |
|---|---|---|---|---|---|---|
| Example 4 | MoSi[10:90] | ○ | 9 Å | 0.34 | 2.85 | 0.07 μm |
| Example 5 | MoSiB[10:85:5] | ○ | 12 Å | 0.32 | 2.73 | 0.05 μm |
| Example 6 | MoSiB[10:80:10] | ○ | 15 Å | 0.30 | 2.47 | 0.03 μm |

Referring to Table 2, Examples 4 and 5 show a result of comparing features of a blankmask when boron (B) was added to a target and when boron (B) was not added to a target, and Examples 5 and 6 show a result of comparing features of a blankmask according to the content of boron (B).

When the amount of boron (B) to be added to a target was increased as in Examples 5 and 6, a variation in the thickness of the light-proof film in terms of the chemical resistance thereof relatively increased but an anisotropic ratio related to the electron-beam repair decreased. Also, as the content of boron (B) increased, an optical density of the light-proof film decreased and a variation iTIR in stress applied to the light-proof film decreased.

However, when all the features of light-proof films according to the examples are considered, the anisotropic ratio, optical density, chemical resistance, variation in stress to be applied thereto, features thereof, etc. were satisfied when the repair process was performed but the optical density exceeded 2.5 in case of Example 6 in which the content of boron (B) was 10 at %.

In a blankmask according to an embodiment of the present invention, a light-proof film and a hard film having a small thickness and high etch selectivity with respect to the light-proof film are formed on a transparent substrate. Accordingly, a photomask having a high-resolution pattern of a half-pitch of 32 nm or less (particularly, a half-pitch of 22 nm or less) can be formed.

Also, in a blankmask and a photomask according to an embodiment of the present invention, a composition ratio of a metal, silicon (Si), and light elements that constitute a light-proof film is adjusted to minimize damages to a pattern (repair damage) caused by an XeF₂ gas in an electron-beam repair process.

While this invention has been particularly shown and described with reference to exemplary embodiments thereof, it will be understood by those of ordinary skill in the art that the present invention is not limited by the exemplary embodiments and various changes in form and details may be made therein without departing from the spirit and scope of the invention as defined by the appended claims. Thus, it is intended that the present invention covers all such modifications provided they come within the scope of the appended claims and their equivalents.

What is claimed is:

1. A blankmask comprising:
   a light-proof film and a hard film formed on a transparent substrate,
   wherein a degree to which the light-proof film is damaged by an injected gas in a repair process after a pattern is formed is digitized in an anisotropic ratio of 0 to 0.5, and
   wherein the anisotropic ratio is a ratio of a lateral damage to an etched depth of the pattern.

2. The blankmask of claim 1, wherein the light-proof film is formed of a molybdenum silicide (MoSi) compound selected from the group consisting of MoSi, MoSiO, MoSiN, MoSiC, MoSiON, MoSiCN, MoSiOC, MoSiCON, MoSiB, MoSiBO, MoSiBN, MoSiBC, MoSiBON, MoSiBCN, MoSiBOC, and MoSiBCON.

3. The blankmask of claim 2, wherein the light-proof film has a composition ratio in which a content of molybdenum (Mo) is 1 at % to 15 at %, a content of silicon (Si) is 40 at % to 80 at %, a content of nitrogen (N) is 15 at % to 35 at %, a content of boron (B) is 0 to 5 at %, a content of carbon (C) is 0 to 5 at %, and a content of oxygen (O) is 0 to 5 at %.

4. The blankmask of claim 2, wherein the light-proof film is formed using a molybdenum silicide (MoSi) target or a molybdenum silicide boron (MoSiB) target,
   wherein the molybdenum silicide (MoSi) target has a composition ratio in which Mo:Si=2 at % to 20 at %:98 at % to 80 at %, and
   the molybdenum silicide boron (MoSiB) target has a composition ratio in which Mo:Si:B=2 at % to 20 at %:97 at % to 70 at %:1 at % to 10 at %.

5. The blankmask of claim 1, wherein the light-proof film has a structure selected from the group consisting of a single-layer film, a continuous single-layer film, a multi-layer film, and a continuous multi-layer film.

6. The blankmask of claim 2, wherein, when the light-proof film has a two-layer structure including a light-shielding film and an anti-reflective film, the light-shielding film and the anti-reflective film are different in terms of a content of at least one among molybdenum (Mo), silicon (Si), and nitrogen (N), wherein a content of molybdenum (Mo) is 0 to 10 at %, a content of silicon (Si) is 0 to 40 at %, and a content of nitrogen (N) is 0 to 10 at %.

7. The blankmask of claim 1, wherein, when the light-proof film has a two-layer structure including a light-shielding film and an anti-reflective film, the light-shielding film has a thickness of 35 nm to 50 nm and the anti-reflective film has a thickness of 3 nm to 20 nm.

8. The blankmask of claim 1, wherein the light-proof film has an optical density of 2.5 to 3.5 at an exposure wavelength of 193 nm.

9. The blankmask of claim 1, wherein the hard film is formed of at least one metal material selected from the group consisting of molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W), and silicon (Si), or is formed of the selected at least one metal material and at least one material selected from the group consisting of oxygen (O), nitrogen (N), carbon (C), and boron (B).

10. The blankmask of claim 1, wherein the hard film is formed of a chromium (Cr) compound selected from the group consisting of Cr, CrO, CrN, CrC, CrON, CrOC, CrCN, CrCON, CrB, CrBO, CrBN, CrBC, CrBON, CrBOC, CrBCN, and CrBCON.

11. The blankmask of claim 1, wherein the hard film has a thickness of 2 nm to 5 nm.

12. A photomask manufactured using the blankmask of at least one of claim 1.

* * * * *